United States Patent [19]

Shinkawa et al.

[11] 4,249,263
[45] Feb. 3, 1981

[54] MIXER CIRCUIT

[75] Inventors: Keiro Shinkawa; Chuichi Sodeyama, both of Yokohama, Japan

[73] Assignee: Hitachi, Ltd., Japan

[21] Appl. No.: 90,611

[22] Filed: Nov. 2, 1979

[30] Foreign Application Priority Data

Nov. 6, 1978 [JP] Japan .................. 53/136554

[51] Int. Cl.³ .............................. H04B 1/26
[52] U.S. Cl. .................. 455/327; 455/330; 455/331
[58] Field of Search ............ 455/323, 325, 326, 327, 455/330, 331

[56] References Cited

U.S. PATENT DOCUMENTS

| 3,735,267 | 5/1973 | Napoli | 455/327 |
| 3,939,430 | 2/1976 | Dickens et al. | 455/327 |

FOREIGN PATENT DOCUMENTS

198419  8/1967  U.S.S.R. .................. 455/326

Primary Examiner—Marc E. Bookbinder
Attorney, Agent, or Firm—Craig & Antonelli

[57] ABSTRACT

A mixer circuit formed of a micro strip line for converting an input signal in SHF band into an intermediate frequency signal in UHF band is disclosed which includes an arch-shaped half-wavelength line having a length equal to one half of the wavelength of the input signal and a series circuit of two diodes connected between both ends of the half-wavelength line, and in which the input signal and a local oscillation signal are applied respectively to the junction point of the diodes and one end of the half-wavelength line, and the intermediate frequency signal is delivered from a given point on the half-wavelength line.

9 Claims, 16 Drawing Figures

MIXER CIRCUIT

BACKGROUND OF THE INVENTION

1. Field of the Invention

The present invention relates to a mixer circuit for converting an input signal in SHF band into an output signal in UHF band, or converting an input signal in UHF band into an output signal in SHF band.

2. Description of the Prior Art

Figure 1:
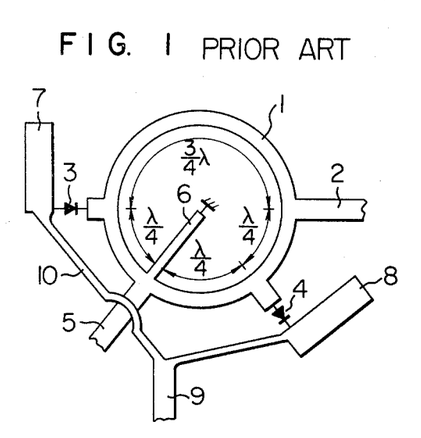
FIG. 1 shows a conventional mixer circuit using a rat race circuit.

For a mixer circuit which is formed of a planar circuit employing a micro strip line and converts a high frequency signal into an intermediate frequency signal, is well known such a circuit employing a rat race circuit as shown in FIG. 1 of the accompanying drawings. The rat race circuit itself is disclosed in a Japanese Patent registration No. 214252 (published on Mar. 7, 1955). In FIG. 1, reference numeral 1 designates a rat race circuit having length nearly equal to three halves of the wavelength of each of a high-frequency input signal and a local oscillation signal. When the local oscillation signal is applied to an input terminal 2 of the rat race circuit 1, the signal is divided in two equal parts which are applied respectively to diodes 3 and 4 with a phase difference of 180 degrees. The high frequency input signal applied to an input terminal 5 is divided into two equal parts which are applied respectively to the diodes 3 and 4 in phase with each other. An intermediate frequency signal produced by the diodes 3 and 4 which has a frequency equal to the difference frequency between the high-frequency input signal and local oscillation signal, is outputted from an intermediate-frequency-signal outputting line 9 provided with stubs 7 and 8 which have a short-circuit impedance for the high-frequency input signal and local oscillation signal, since the rat race side of the diodes 3 and 4 is grounded through a circuit 6 having an inductive impedance. Though the above mixer employing the rat race circuit has an advantage that the local oscillation signal does not appear on the input terminal 5 which receives the high frequency signal, the mixer has drawbacks that a multilayered wiring 10 is required to fabricate the intermediate-frequency-signal outputting line 9, that the size of the mixer becomes large since the length of the rat race circuit is nearly equal to three halves of the wavelength of each of the input signal and the local oscillation signal, and that it is not possible to arrange the input and output lines freely because of the predetermined shape of the rat race circuit.

SUMMARY OF THE INVENTION

A main object of the present invention is to provide a mixer circuit which can eliminate the above-mentioned drawbacks encountered with the conventional mixer, and which is small in size and has a simple structure because of the absence of multilayered wiring.

In order to attain the above object, according to the present invention, there is provided a mixer circuit formed of a strip line and applied with first and second signals or delivering a third signal obtained by combining the first and second signals, which comprises: (a) a ½ wavelength line 11 having a length nearly etual to one half of the wavelength of each of two signals out of the first, second and third signals, the remaining signal having the lowest frequency; (b) a series circuit of two diodes 12, 13 connected between both ends of the ½ wavelength line, the diodes being arranged with the same polarity; (c) first and second signal coupling means for coupling the two signals other than the lowest-frequency signal between a first connecting point and ground and between a second connecting point and ground, respectively, the first and second connecting points being defined respectively by the junction point of the diodes and one end of the ½ wavelength line; (d) third signal coupling means for coupling the lowest-frequency signal between the first connecting point and ground or between a third connecting point and ground, the third connecting point being defined by the middle point of the ½ wavelength line; and (e) means 17 having a low impedance for the lowest-frequency signal, the means 17 being connected between the first connecting point and ground or between the third connecting point and ground according as the lowest-frequency signal is coupled between the third connecting point and ground or between the first connecting point and ground.

DESCRIPTION OF THE PREFERRED EMBODIMENTS

Now, the present invention will be explained below in detail by means of various embodiments thereof.

Figure 2:
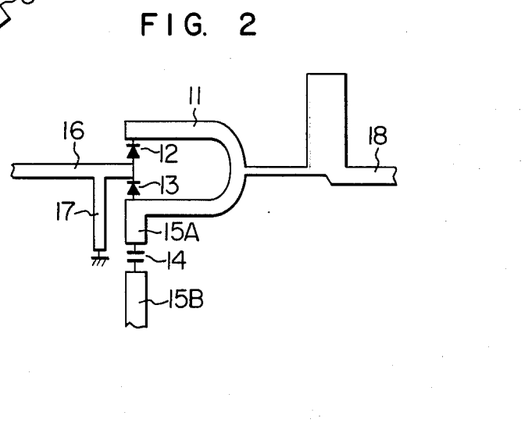
FIGS. 2 to 4 show first, second and third embodiments of a mixer circuit according to the present invention, respectively.

In FIG. 2 showing the first embodiment of the present invention, reference numeral 11 indicates a ½ wavelength line having a length nearly equal to one half of the wavelength of each of a high-frequency input signal and a local oscillation signal. Let us consider a case where the high-frequency input signal having a frequency $f_1$ of 12 GHz and the local oscillation signal having a frequency $f_2$ of 11.43 GHz are employed to produce an intermediate frequency signal having a frequency $f_3$ of 570 MHz, and where an alumina substrate (not shown) having a relative dielectric constant of 10 is employed. The half-wavelength of the high-frequency input signal and that of the local oscillation signal are equal respectively to 5 mm and 5.25 mm when these signals are propagated in the surface of the alumina substrate. That is, the difference in half-wavelength between these signals is only 0.25 mm. The diodes 12 and 13 are series-connected between both ends of the ½ wavelength line 11 in such a manner that the diodes have the same polarity. An input line 15 for inputting the local oscillation signal which is made up of two parts 15A and 15B and is provided with a capacitive circuit 14, is connected to one end of the ½ wavelength line 11. An input line 16 for inputting the high-frequency input signal which is provided with an inductive circuit 17 having a short-circuit impedance for the intermediate frequency signal, is connected to the junction point of the diodes 12 and 13. An output line 18 for outputting the intermediate frequency signal which has an open-circuit impedance for the high-frequency input signal and local oscillation signal, is connected to the ½ wavelength line 11. Since the ½ wavelength line 11 has a length equal to one half of the wavelength of the local oscillation signal, the local oscillation signal inputted to the input line 15 are applied to the diodes 12 and 13 in such a manner that the local oscillation signal applied to the diode 12 is 180° out of phase with that applied to the diode 13. Thus, the above two local oscillation signals cancel each other. That is, the junction point of the diodes 12 and 13 is equivalently short-circuited. Since such a junction point of the diodes 12 and 13 is connected to the input line 16 for inputting the high-frequency input signal, the leakage of local oscillation signal to the input line 16 never takes place. While, the high-frequency input signal inputted to the input line 16 is applied to the diodes 12 and 13 in the same phase. Since the length of the ½ wavelength line 11 is nearly equal to one half of the wavelength of the high-frequency input signal, the junction points between the ½ wavelength line 11 and the diodes 12 and 13 are equivalently short-circuited for the high-frequency input signal. That is, the local oscillation signal applied to the diode 12 is 180° out of phase with that applied to the diode 13, and the high-frequency input signal applied to the diode 12 is in phase with that applied to the diode 13. Since the diodes 12 and 13 are arranged so as to have the same polarity, each of the diodes 12 and 13 generates the intermediate frequency signal which has the same phase for the ½ wavelength line 11 and has a low frequency equal to the difference frequency between the local oscillation signal and the high-frequency input signal. On the other hand, since the junction point of the diodes 12 and 13 has a short-circuit impedance for the intermediate frequency signal due to the inductive circuit 17 provided on the input line 16, and since the input line 15 has an open-circuit impedance for the intermediate frequency signal due to the capacitive circuit 14, the intermediate frequency signals generated by the diodes 12 and 13 are combined with each other by the ½ wavelength line 11, and then delivered through the output line 18 for outputting the intermediate frequency signal. The output line 18 is connected to the ½ wavelength line 11 through a low pass filter having an open-circuit impedance for the local oscillation signal and high-frequency input signal, in order not to disturb the operation of these signals. As is apparent from the foregoing description, the above structure can provide a mixer which is small in size, does not require any multilayered wiring, and can prevent the leakage of the local oscillation signal to the high-frequency-signal input line. Further, since the length of the ½ wavelength line 11 is far smaller than the wavelength of the intermediate frequency signal, it is possible to connect the output line 18 to a given point on the ½ wavelength line 11. Incidentally, the half wavelength of the high-frequency input signal having a frequency $f_1$ of 12 GHz is equal to 5 mm in the surface of the alumina substrate having a relative dielectric constant of 10, as has been explained previously. While, the wavelength of the intermediate frequency signal having a frequency $f_3$ of 570 MHz is equal to 210.5 mm in the surface of the alumina substrate. That is, the length of the ½ wavelength line 11 is equal to several % of the wavelength of the intermediate frequency signal.

Further, such a structure as connecting the output line 18 to that part of the input line 15 which is connected with the ½ wavelength line 11, namely, the part 15A, can produce the same effect as the structure shown in FIG. 2.

Figure 3:
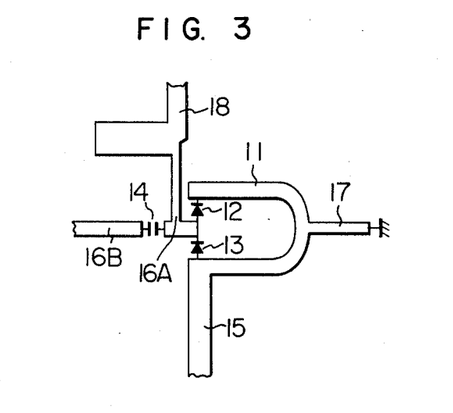

FIG. 3 shows the second embodiment of a mixer circuit according to the present invention, and indicates circuit elements or parts equivalent to those in FIG. 2 by the same reference numerals. Referring to FIG. 3, the inductive circuit 17 having a short-circuit impedance for a low-frequency signal is connected to the ½ wavelength line 11 or to the input line 15 for inputting the local oscillation signal, the capacitive circuit 14 is inserted between parts 16A and 16B which make up the input line 16 for inputting the high-frequency input signal, and the output line 18 for outputting the intermediate frequency signal is connected between the capacitive circuit 14 and the diodes 12 and 13. The intermediate frequency signal generated by the diodes 12 and 13 is efficiently delivered from the output line 18, since the line 11 is short-circuited by the inductive circuit 17 for the intermediate frequency signal. Other functions and effects of the embodiment shown in FIG. 3 are the same as those of the embodiment shown in FIG. 2.

Figure 4:
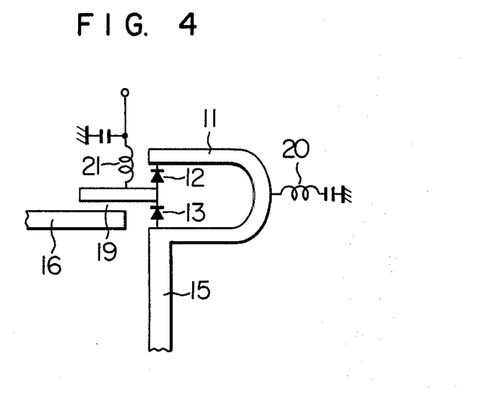

The shape and structure of each of the inductive circuit, the capacitive circuit and the output line for outputting the intermediate frequency signal are not limited to those shown in FIGS. 2 and 3. As is shown in FIG. 4, the capacitive circuit may be formed of a gap 19 between parallel-coupled lines, the inductive circuit may be formed of a series resonance circuit 20 which is made up of an inductance and a capacitance, and the output line may be formed of a low pass filter 21 which is made up of an inductance and a capacitance. Accordingly, the capacitive circuit, the inductive circuit and the output line include herein the above-mentioned means and circuit.

Further, the above embodiments can produce the same effect as mentioned above, even when the high-frequency input signal and the local oscillation signal are replaced with each other. The mixing circuits (or mixers) which are shown and explained hereinbefore, have features that these circuits are small in size and simple in structure, that the multilayered wiring is not required, that the arrangement of input and output terminals can be varied to a certain degree, and that the leakage of the local oscillation signal to the input terminal which received the high-frequency input signal, is prevented.

The above-mentioned embodiments of a mixer circuit according to the present invention, however, are not possessed of such function as suppressing an image signal having a frequency equal to the difference between the frequency of the high-frequency input signal and the frequency which is twice as high as the frequency of the local oscillation signal. Incidentally, when the frequencies $f_1$ and $f_2$ of the high-frequency input signal and local oscillation signal are equal respectively to 12 GHz and 11.43 GHz, the image signal has a frequency $f_4$ of 10.86 GHz. Accordingly, when the high-frequency input signal and the local oscillation signal are applied to the diodes 12 and 13, the image signal caused by the distortion of third order of each diode is generated in such a manner that the image signal generated by the diode 12 is 180° out of phase with that by the diode 13. Since the ½ wavelength line 11 has a length nearly equal to the wavelength of the image signal, the image signals thus generated are combined with each other in the input line 15 for inputting the local oscillation signal, and sent out therethrough. As a result, the generation efficiency of the intermediate frequency signal which is caused by the secondary distortion of each diode, is decreased, and therefore the conversion efficiency in which the high-frequency input signal is converted into the intermediate frequency signal, is lowered. Further, when an external disturbing wave in the image-signal frequency band is applied to the input line 16 for inputting the high-frequency input signal, a disturbing wave in the intermediate frequency band is generated. That is, the mixer circuit are adversely affected by an external image signal.

The above-mentioned drawbacks can be eliminated by appropriately arranging a parallel-coupled band stop filter (BSF). The parallel-coupled BSF is formed in the following manner. That is, one half portion of a line having opened ends and having a length equal to one half of the wavelength of the image signal, is placed in close proximity to and parallel to a transmission line, and the other half portion is spaced apart from the transmission line. The parallel coupled BSF itself is disclosed in, for example, "IEEE TRANSACTIONS ON MICROWAVE THEORY AND TECHNIQUES", Vol. MTT-22, No. 5, May, 1974.

Figure 5:
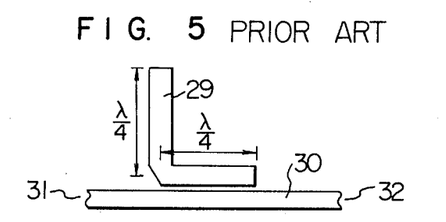
FIG. 5 shows a conventional parallel-coupled band stop filter.

FIG. 5 shows the structure of a conventional parallel-coupled BSF. Referring to FIG. 5, a resonant line 29 having opened ends whose length is equal to one half of the wavelength of the image signal, is arranged in such a manner that one half portion of the resonant line 29 is placed in close proximity to and parallel to a transmission line 30 and the remaining half portion is spaced apart from the transmission line 30. This parallel-coupled BSF exhibits a narrow-band stopping characteristic such as stopping only the image-signal frequency band. The coupling between the resonant line 29 and the transmission line 30 is extinguished for signals outside the above band, and therefore the transmission characteristic of the line 30 is left as it is for such signals. Further, as is well-known, at the center frequency of the above stopped band, the transmission line 30 has a short-circuit impedance when viewed from one terminal 31 of the transmission line 30, and has an open-circuit impedance when viewed from the other terminal 32.

Figure 6:
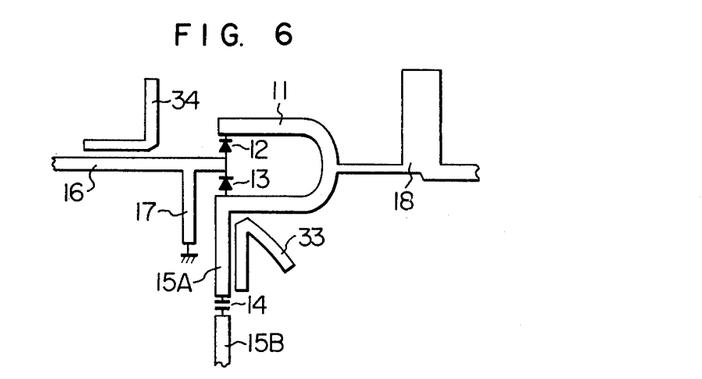
FIGS. 6 to 8 show fourth, fifth and sixth embodiments of a mixer circuit according to the present invention, respectively.
Figures 7, 8:
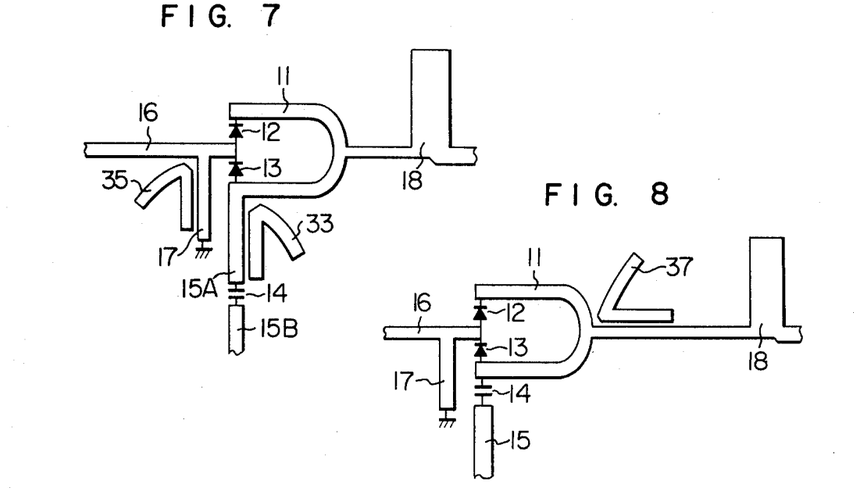

FIG. 6 shows a fourth embodiment of the present invention. Referring to FIG. 6, a parallel-coupled BSF 33 is provided along the input line 15 (made up of parts 15A and 15B) for inputting the local oscillation signal of the embodiment shown in FIG. 2, in such a manner that the impedance of the input line 15 viewed from each diode becomes equal to a short-circuit impedance at the image frequency. Therefore, the image signals, one of which is generated by the diode 12 and is 180° out of phase with the other image signal generated by the diode 13, are combined with each other at a junction point between the ½ wavelength line 11 and the input line 15, but are short-circuited thereat by the parallel-coupled BSF 33. As a result, the generation of image signal by the diodes 12 and 13 is suppressed, and the generation of intermediate frequency signal is increased. However, the parallel-coupled BSF 33 cannot suppress the disturbance by the application of the external image signal. Therefore, it is necessary to provide a parallel-coupled BSF 34 for suppressing the above disturbance. However, when the parallel-coupled BSF 34 is coupled directly to the input line 16 for inputting the high-frequency input signal, a loss in high-frequency input signal results from the coupling (or insertion) of the BSF 34. In order to reduce such a loss, as is shown in FIG. 7, a parallel-coupled BSF 35 is provided along the inductive circuit 17 in such a manner that the impedance of the inductive circuit 17 viewed from the input line 16 becomes equal to a short-circuit impedance for the image signal. Then, the loss in high-frequency input signal resulting from the installation of parallel-coupled BSF is reduced, and moreover the disturbance due to the application of external image signal can be prevented.

Figure 9:
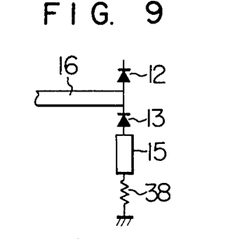
FIG. 9 shows an equivalent circuit for explaining the operation of a mixer circuit according to the present invention.

Further, as is shown in FIG. 8, the output line 18 for outputting the intermediate frequency signal which has an open-circuit impedance for the high-frequency input signal and local oscillation signal, is connected to the middle point of the ½ wavelength line 11. A parallel-coupled BSF 37 is provided along the output line 18 in such a manner that the impedance of the output line 18 viewed from the ½ wavelength line 11 becomes equal to a short-circuit impedance for the image signal. With the above structure, both the image signal generated by the diodes 12 and 13 are the disturbance due to the application of external image signal can be suppressed. This is because the middle point of the ½ wavelength line 11 is short-circuited for the image signal and thus the impedance of the line 11 viewed from the diodes assumes a high value for the image signal, that is, because the embodiment shown in FIG. 8 can be rewritten, at the image frequency, by the equivalent circuit shown in FIG. 9. In more detail, since one end of the diode 12 is made open-circuit as is shown in FIG. 9, the diode 12 does not generate the image signal nor produces the disturbance due to the application of external image signal. Further, since one end of the diode 13 is connected through the input line 15 to a local-oscillation-signal source having an impedance 38, the diode 13 produces a slight disturbing wave when applied with an external image signal, and generates the image signal only a little. That is, the embodiment shown in FIG. 8 can suppress the generation of both the image signal and the disturbing wave.

Figure 10:
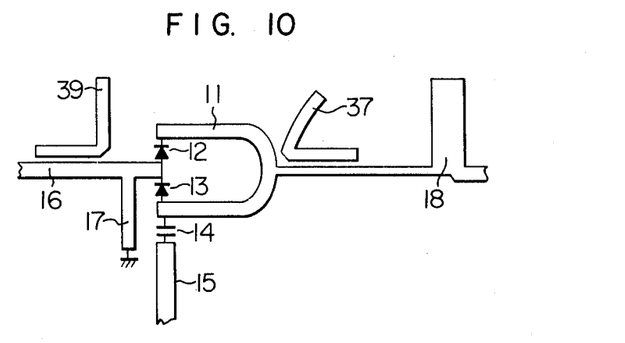
FIGS. 10 to 16 show seventh, eighth, ninth, tenth, eleventh, twelfth and thirteenth embodiments of a mixer circuit according to the present invention, respectively.
Figures 11, 12:
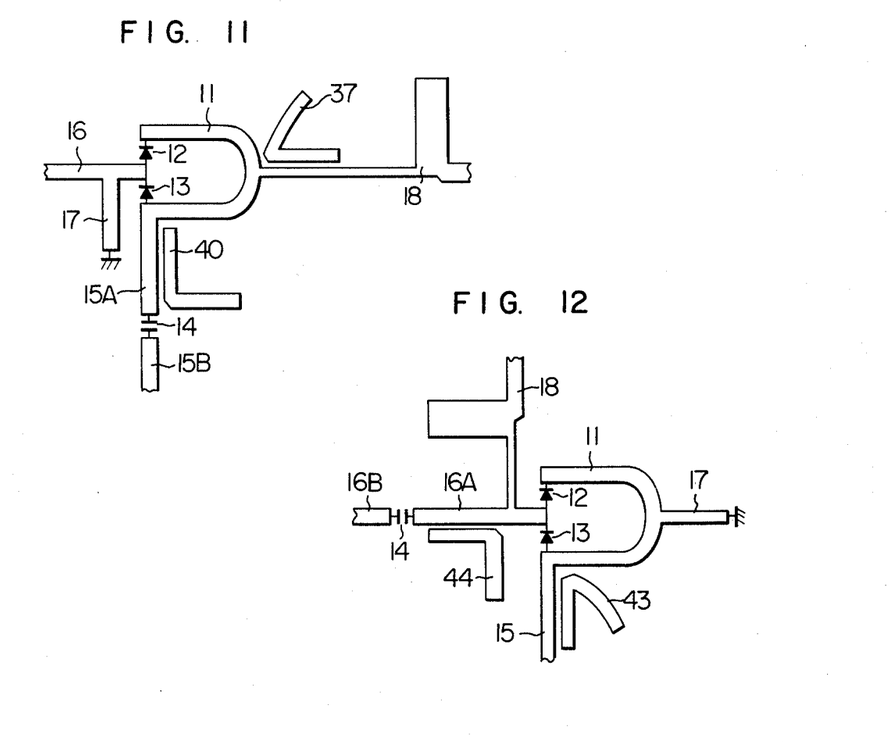

As can be understood from the equivalent circuit shown in FIG. 9, the embodiments shown in FIGS. 10 and 11 can completely suppress the generation of the image signal and disturbing wave. That is, in the embodiment shown in FIG. 10, a parallel-coupled BSF 39 is provided along the input line 16 for inputting the high-frequency input signal in such a manner as making the impedance of the input line 16 viewed from the diode 13 equal to an open-circuit impedance at the image frequency. While, in the embodiment shown in FIG. 11, a parallel-coupled BSF 40 is provided along the input line 15 for inputting the local oscillation signal in such a manner as making the impedance of the input line 15 viewed from the diode 13 equal to an open-circuit impedance at the image frequency. Specifically, the embodiment shown in FIG. 11 is small in loss of high-frequency input signal since the parallel-coupled BSF 40 is not provided along the input line 16, and moreover can suppress the generation of image signal. Accordingly, this embodiment has an improved conversion efficiency, and moreover can suppress the generation of disturbing wave due to the application of external image signal.

When the high-frequency input signal and the local oscillation signal are applied respectively to the input lines 15 and 16 in the embodiments shown in FIGS. 6 to 8, 10 and 11, the image signal generated by the diode 12 is in phase with that generated by the diode 13, and these image signals are outputted from the input line 16. In the mixing circuit shown in FIG. 6, the parallel-coupled BSF 33 having been provided along the input line 15 must be provided along the input line 16 or the inductive circuit 17 in such a manner that the impedance of the input line 16 or inductive circuit 17 viewed from the diodes becomes equal to a short-circuit impedance for the image signal, in order to suppress the generation of image signal. Further, the parallel-coupled BSF 34 for suppressing the disturbing wave caused by the application of external image signal must be provided along the input line 15. Similarly, in the mixer circuit shown in FIG. 7, the parallel-coupled BSF 33 for suppressing the generation of image signal by the diodes is provided along the input line 16 or the inductive circuit 17, and the parallel-coupled BSF 35 for suppressing the disturbing wave caused by the application of external image signal is provided along the input line 15. When the above modification is made in the embodiments shown in FIGS. 6 and 7, and when the high-frequency input signal and the local oscillation signal are replaced with each other, the mixers thus modified can produce the same effect as the original embodiments. Further, the mixer circuits shown in FIGS. 8, 10 and 11 can produce the same operation and effect as mentioned previously, even when the high-frequency input signal and the local oscillation are replaced with each other.

Figure 13:
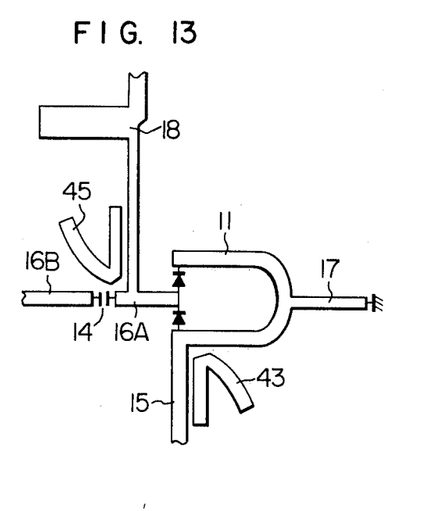

FIG. 12 shows a further embodiment of the present invention. Referring to FIG. 12, a parallel-coupled BSF 43 is provided along the input line 15 of the embodiment shown in FIG. 3 in such a manner that the impedance of the input line 15 for inputting the local oscillation signal viewed from the diodes becomes equal to a short-circuit impedance at the image frequency. Then, the image signals generated by the diodes 12 and 13, which are 180° out of phase with each other, are short-circuited by the parallel-coupled BSF 43 at the junction point between the ½ wavelength line 11 and the input line 15 where the image signals are to be combined with each other. As a result, the generation of image signal by the diodes is suppressed, and the generation of intermediate frequency signal is increased. However, since the parallel-coupled BSF 43 cannot suppress the disturbing wave resulting from the application of external image signal, it is necessary to provide a parallel-coupled BSF 44 for suppressing the disturbing wave along the input line 16 (made up of the parts 16A and 16B). In a case where the parallel-coupled BSF 44 is provided, as shown in FIG. 12, along the input line 16, a loss in high-frequency input signal is inevitable due to the existence of the parallel-coupled BSF 44. In order to reduce such a loss, a parallel-coupled BSF 45 is provided, as shown in FIG. 13, along the output line 18 for outputting the intermediate frequency signal in such a manner that the impedance of the output line 18 viewed from the input line 16 becomes equal to a short-circuit impedance at the image frequency. Then, the loss in high-frequency input signal due to the parallel-coupled BSF is decreased, and moreover the above-mentioned disturbing wave can be suppressed.

Figure 14:
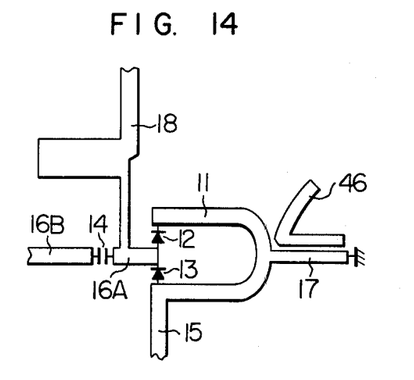

Further, in a case where, as is shown in FIG. 14, the inductive circuit 17 having an open-circuit impedance for the high-frequency input signal and local oscillation signal and having a low impedance for the intermediate frequency signal is connected to the middle point of line 11, and where a parallel-coupled BSF 46 is provided along the inductive element 17 in such a manner that the impedance of the inductive element 17 viewed from the line 11 becomes equal to a short-circuit impedance for the image signal, the image signal generated by the diodes and the disturbing wave resulting from the application of external image signal are both suppressed. In this case, since the middle point of the line 11 is short-circuit for the image signal, the impedance of the line 11 viewed from the diodes is high at image frequency, and therefore the embodiment shown in FIG. 14 is equivalent, at the image frequency, to the circuit shown in FIG. 9. Accordingly, the embodiment shown in FIG. 14 can suppress both of the image signal and the above-mentioned disturbing wave, on the basis of the function and operation which have been explaiend previously in connection with the circuit shown in FIG. 9.

Figure 15:
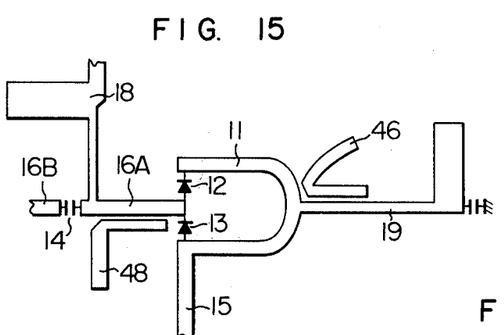
Figure 16:
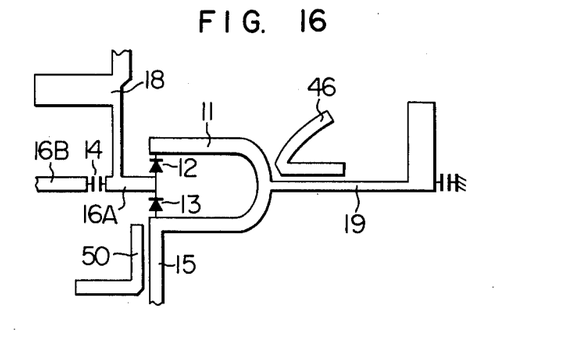

As is apparent from the equivalent circuit shown in FIG. 9, in order to completely suppress the image signal, one end of the diode 13 must have an open-circuit impedance for the image signal. In view of this fact, in the embodiment shown in FIG. 15, a parallel-coupled BSF 48 is provided along the input line 16 in such a manner as making the impedance of the input line 16 viewed from the diode 13 equal to an open-circuit impedance for the image signal. While, in the embodiment shown in FIG. 16, a parallel-coupled BSF 50 is provided along the input line 15 so as to make the impedance of the input line 15 viewed from the diode 13 equal to an open-circuit impedance at the image frequency. Thus, the suppression of both of the image signal and the disturbing wave is almost achieved. Further, as is shown in FIGS. 15 and 16, a series resonance circuit 19, which is made up of an inductor and a capacitor and has a short-circuit impedance for the intermediate frequency signal, may be used in place of the inductive circuit 17.

When, in the embodiments shown in FIGS. 12 to 16, the high-frequency input signal and the local oscillation signal are applied to the input line 15 for inputting the local oscillation signal and the input line 16 for inputting the high-frequency input signal, respectively, the image signals generated by the diodes 12 and 13 are in phase with ecch other, and are delivered from the input line 16. In order to suppress such image signals, it is necessary to arrange a parallel-coupled BSF in the following manner, that is, in the mixing circuit shown in FIG. 12, the parallel-coupled BSF 13 having been provided along the input line 15 must be provide along the input line 16 or the output line 18 in such a manner as making the impedance of the input line 16 or the output line 18 viewed from the diodes equal to a short-circuit impedance at the image frequency, and the parallel-coupled BSF 44 for suppressing the external image signal must be provided along the input line 15. The mixing circuit thus modified can produce the same effect as mentioned previously in connection with FIG. 12, when the high-frequency input signal and the local oscillation signal are applied to the input lines 15 and 16, respectively. Similarly, in the mixing circuit shown in FIG. 13, the parallel-coupled BSF 43 for suppressing the image signal generated by the diodes must be provided along the input line 16 or the output line 18, and the parallel-coupled BSF 45 for suppressing the external image signal must be provided along the input line 15, in order to obtain the same effect as mentioned previously in connection with FIG. 13. Further, the mixing circuits shown in FIGS. 14, 15 and 16 can produce the same operation and effect as mentioned previously, even when the high-frequency input signal and the local oscillation signal are applied to the input line 15 for inputting the local oscillation signal and the input line 16 for inputting the high-frequency input signal, respectively.

As has been explained in detail hereinbefore, according to the present invention, there is provided a mixing circuit which is small in size and simple in construction, and in which no multilayered wiring is required, the arrangement of input and output lines can be varied to a certain degree, the leakage of local oscillation signal to the input line for inputting the high-frequency input signal is prevented, the generation of image signal by the diodes is suppressed to enhance the conversion efficiency of the mixing circuit, and moreover the disturbance due to the application of external image signal can be avoided.

In addition to the above-mentioned embodiments, various devices can be made in accordance with the present invention. For example, an up-converter can be provided which has the same circuit construction as each of the above-mentioned embodiments, and in which the output terminal for outputting the intermediate frequency signal and the input terminal for inputting the local oscillation signal are applied respectively with the high-frequency input signal and the local oscillation signal to deliver, from the input terminal for inputting the high-frequency input signal, a high frequency signal having a frequency higher than the frequency of the high-frequency input signal. Further, an AM modulator is provided which has the same circuit construction as each of the embodiments, and in which the output terminal for outputting the intermediate frequency signal and the input terminal for inputting the local oscillation signal are applied respectively with a low frequency signal and a high frequency signal to deliver the high frequency signal modulated by the low frequency signal from the input terminal for inputting the high-frequency input signal.

We claim:

1. A mixer circuit formed of a strip line and applied with first and second signals for delivering a third signal obtained by combining said first and second signals, wherein one of said three signals has a frequency lower than the frequencies of the other two signals, comprising:
   (a) a ½ wavelength line having a length nearly equal to one half of the wavelength of each of two signals out of said first, second and third signals, the remaining signal having the lowest frequency;
   (b) a series circuit of two diodes connected between both ends of said ½ wavelength line, said diodes being arranged with the same polarity;
   (c) first and second signal coupling means for coupling said two signals other than said lowest-frequency signal between a first connecting point and ground and between a second connecting point and ground, respectively, said first and second connecting points being defined respectively by the junction point of said diodes and one end of said ½ wavelength line;
   (d) third signal coupling means for coupling said lowest-frequency signal between said first connecting point and ground or between a third connecting point and ground, said third connecting point being defined by the middle point of said ½ wavelength line: and
   (e) means having a low impedance for said lowest-frequency signal, said means being connected between said first connecting point and ground or between said third connecting point and ground in accordance with said lowest-frequency signal being coupled between said third connecting point and ground or between said first connecting point and ground, respectively.

2. A mixer circuit according to claim 1, wherein said ½ wavelength line is formed of a conductor having a length equal to one half of the wavelength of a high-frequency input signal in SHF band corresponding to said first signal; and wherein said first signal coupling means serve as signal inputting means for inputting said high-frequency input signal corresponding to said first signal, said second signal coupling means serve as signal inputting means for inputting a local oscillation signal in SHF band corresponding to said second signal, and said third signal coupling means serve as signal outputting means for outputting an intermediate-frequency output signal corresponding to said third signal.

3. A mixer circuit according to claim 2, wherein said first, second and third signal coupling means are connected to said first, second and third connecting points, respectively, and wherein means having a low impedance at an intermediate frequency are connected to said first connecting point.

4. A mixer circuit according to claim 2, wherein said first, second and third signal coupling means are connected to said second, first and third connecting points, respectively, and wherein means having a low impedance at an intermediate frequency are connected to said first connecting point.

5. A mixer circuit according to claim 2, wherein said first, second and third signal coupling means are connected to said first, second and third connecting points, respectively, and wherein means having a low impedance at an intermediate frequency are connected to said third connecting point.

6. A mixer circuit according to claim 1, wherein said ½ wavelength line is formed of a conductor having a length equal to one half of the wavelength of a high-frequency output signal corresponding to said third signal; and wherein said third signal coupling means serve as signal inputting means for inputting a high-frequency input signal corresponding to said first signal, said second signal coupling means serve as signal inputting means for inputting a local oscillation signal corresponding to said second signal, and said first signal coupling means serve as signal outputting means for outputting said high-frequency output signal corresponding to said third signal.

7. A mixer circuit according to claim 1, wherein said ½ wavelength line is formed of a conductor having a length equal to one half of the wavelength of a high-frequency output signal corresponding to said third signal, and wherein said third signal coupling means serve as signal inputting means for inputting a low-frequency input signal which corresponds to said first signal and is a modulating wave, said second signal coupling means serve as signal inputting means for inputting a high-frequency input signal which corresponds to said second signal and is subjected to modulation, and said first signal coupling means serve as signal outputting means for outputting said high-frequency output signal which corresponds to said third signal and is said high-frequency input signal modulated by said low-frequency input signal.

8. A mixer circuit according to claim 2, wherein a parallel-coupled band stop filter for attenuating a signal having an image frequency is coupled to at least one of said first, second and third signal coupling means and means having a low impedance at an intermediate frequency.

9. A mixer circuit formed of a strip line comprising:
(a) a ½ wavelength line formed of a conductor having a length equal to one half of the wavelength of a high-frequency input signal;
(b) a series circuit of two diodes connected between both ends of said ½ wavelength line, said diodes being arranged with the same polarity;
(c) signal inputting means connected between ground and one of first and second connecting points for inputting said high-frequency input signal, said first and second connecting points being defined by the junction point of said diodes and one end of said ½ wavelength line, respectively;
(d) signal inputting means connected between ground and the other of said first and second connecting points for inputting a local oscillation signal;
(e) signal outputting means for outputting an intermediate-frequency output signal, said signal outputting means having an open-circuit impedance for said high-frequency input signal and said local oscillation signal and being connected between ground and one of said first connecting point and a third connecting point or a given point on a conductor connected to said one of said first and third connecting points, said third connecting point being defined by the middle point of said ½ wavelength line; and
(f) means having a low impedance at an intermediate frequency and connected between ground and the other of said first and third connecting points or a given point on a conductor connected to said other connecting point.

* * * * *